US012674824B2

(12) United States Patent
Rönisch et al.

(10) Patent No.: US 12,674,824 B2
(45) Date of Patent: Jul. 7, 2026

(54) SENSOR WITH A LIGHT GUIDE CONNECTION

(71) Applicant: duotec GmbH, Halver (DE)

(72) Inventors: Arthur Rönisch, Kierspe (DE); Lukas Joslowski, Iserlohn (DE)

( * ) Notice: Subject to any disclaimer, the term of this patent is extended or adjusted under 35 U.S.C. 154(b) by 300 days.

(21) Appl. No.: 18/027,330

(22) PCT Filed: Nov. 16, 2021

(86) PCT No.: PCT/EP2021/081834
§ 371 (c)(1),
(2) Date: Oct. 23, 2023

(87) PCT Pub. No.: WO2022/058625
PCT Pub. Date: Mar. 24, 2022

(65) Prior Publication Data
US 2024/0125822 A1     Apr. 18, 2024

(51) Int. Cl.
*G01R 15/24*     (2006.01)
*G01R 15/22*     (2006.01)
*G01R 33/032*     (2006.01)

(52) U.S. Cl.
CPC ........... *G01R 15/245* (2013.01); *G01R 15/22* (2013.01); *G01R 15/247* (2013.01); *G01R 33/032* (2013.01)

(58) Field of Classification Search
CPC .... G01R 15/22; G01R 15/245; G01R 15/247; G01R 33/032
(Continued)

(56) References Cited

U.S. PATENT DOCUMENTS

| 4,897,541 | A | 1/1990 | Phillips |
| 5,066,903 | A | 11/1991 | Ochi |
(Continued)

FOREIGN PATENT DOCUMENTS

| DE | 40 37 737 A1 | 6/1991 |
| DE | 689 07 800 T2 | 2/1994 |
(Continued)

OTHER PUBLICATIONS

Wickenbrock et al.; "Microwave-free magnetometry with nitrogen-vacancy centers in diamond"; Aug. 2, 2016; Appl. Phys. Lett.; 109, 053505 (Year: 2016).*
(Continued)

*Primary Examiner* — Alesa Allgood
*Assistant Examiner* — Rahul Maini
(74) *Attorney, Agent, or Firm* — Cahn & Samuels, LLP

(57)     ABSTRACT

A system for measuring a current intensity of a current flowing through an electrical conductor (10), where the system includes a first component (1), which has the electrical conductor (10), and a second component (2), which is separate from the first component (1) and has an evaluation device (23), and a magnetic field-sensitive sensor element (3) and a connection line (4). The connection line (4) is a light guide. The sensor element (3) is non-releasably connected to the first end of the connection line (4) and/or to the first component (1). In the operating state, the two components 1(, 2) are DC-isolated from one another and are releasably connected to one another by means of the connection line (4) by way of a light-guiding connection, where the power supply to the magnetic field-sensitive sensor element (3) by the second component (2) and/or transmission of sensor data from the magnetic field-sensitive sensor element (3) to the evaluation device (23) is ensured by the light-guiding connection.

21 Claims, 1 Drawing Sheet

Figures 1, 2:
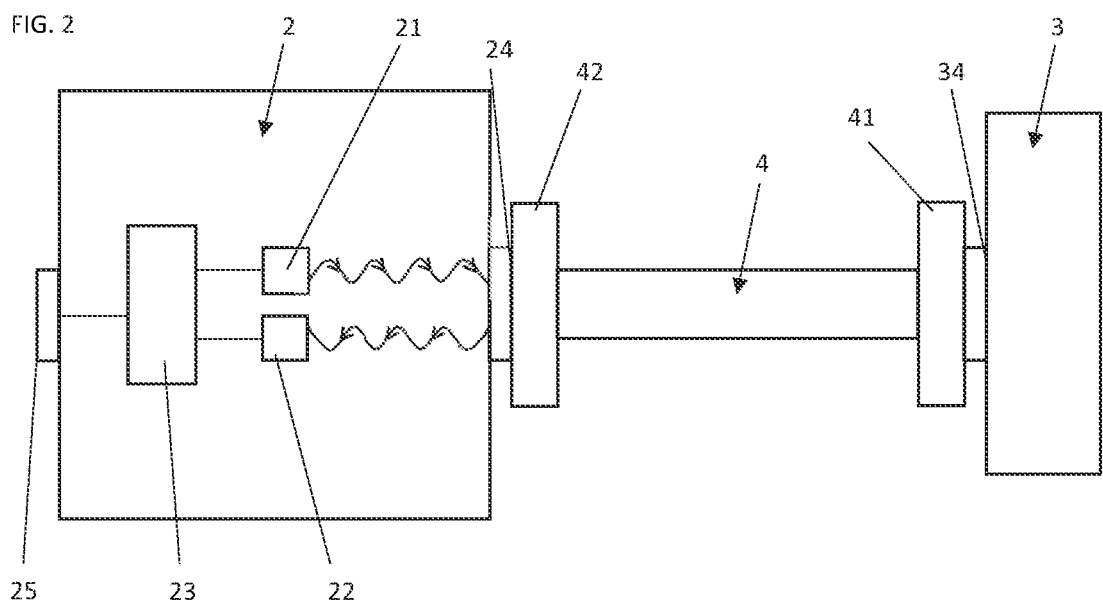

(58) Field of Classification Search
USPC ....................................................... 324/244.1
See application file for complete search history.

(56) References Cited

U.S. PATENT DOCUMENTS

| | | | |
|---|---|---|---|
| 10,488,470 B2 | 11/2019 | Lutz et al. | |
| 2002/0081080 A1* | 6/2002 | Balle-Petersen ..... | G02B 6/4296 |
| | | | 385/92 |
| 2007/0279051 A1* | 12/2007 | Kataoka ............ | H01M 8/04731 |
| | | | 324/226 |
| 2011/0051145 A1 | 3/2011 | Haywood | |
| 2013/0009678 A1* | 1/2013 | Motz ................... | G01R 33/075 |
| | | | 327/124 |
| 2016/0116506 A1 | 4/2016 | Ringsrud | |
| 2019/0154766 A1* | 5/2019 | Lutz ................... | G01R 33/1284 |
| 2022/0146605 A1* | 5/2022 | Frangeskou ......... | G01R 33/445 |
| 2023/0349989 A1* | 11/2023 | Burchard ........... | G01R 33/3621 |

FOREIGN PATENT DOCUMENTS

| | | | |
|---|---|---|---|
| DE | 10 2015 208 151 A1 | 11/2016 | |
| WO | 2019/122693 A1 | 6/2019 | |

OTHER PUBLICATIONS

European Patent Office, English translation of International Preliminary Report on Patentability for PCT App. No. PCT/EP2021/081834, Feb. 23, 2023, pp. 1-9.
European Patent Office, International Search Report in PCT App. No. PCT/EP2021/081834, Mar. 4, 2022, pp. 1-4.
European Patent Office, International Preliminary Report on Patentability for PCT App. No. PCT/EP2021/081834, Feb. 23, 2023, pp. 1-33.

* cited by examiner

SENSOR WITH A LIGHT GUIDE CONNECTION

The invention relates to a system and method for measuring a current intensity of a current flowing through an electrical conductor.

The measurement of electrical currents in electrical conductors has gained considerable importance due to the ubiquitous use of electronic components and the associated need to measure or monitor current flows. In this context, it is usually necessary to determine the current intensity in the electrical conductor while the electrical conductor is integrated in a first component in which it performs its intended function. The measurement or determination of the current intensity is usually carried out by providing a sensor element which is connected to the evaluation device via a connection line. During the measurement, the sensor element must be in a defined position relative to the conductor. In prior art, a variety of possibilities for measuring current intensities in electrical conductors are known. For example, it is known to provide a measuring resistor as a sensor element, wherein during a current intensity measurement via the connection line, a voltage drop present across the measuring resistor is measured by the evaluation device and the measuring resistor is integrated in the circuit of the electrical conductor in such a way that a value for the current intensity flowing through the conductor is determined via the voltage drop. For example, it is known to provide a magnetic field-sensitive sensor element as the sensor element, for example a Hall element or a coil-based element, wherein this magnetic field-sensitive sensor element is arranged in a spatially fixed position relative to the conductor and the voltage applied to the sensor element is measured. Because of the dependence of the output voltage output by the sensor element on the magnetic field strength applied to the sensor element and the spatially fixed arrangement of the sensor element relative to the electrical conductor, a value for the current intensity flowing through the conductor can be determined by the output voltage output by the sensor element.

The systems and methods known in prior art are in principle already very well suited for a precise determination of a current intensity flowing through the electrical conductor. However, the systems and methods known in prior art have various disadvantages. The conventional use of measuring resistors as a sensor element requires integration of the sensor element in the circuit of the electrical conductor and galvanic contacting of the measuring resistor, which on the one hand entails the risk of measurement falsification, and on the other hand complicates and thus increases the cost of manufacturing the first component with the electrical conductor, which furthermore makes scalability, i.e., the use of a simple measuring device for measuring current intensities in a large number of different electrical conductors, impossible and in addition makes it extremely difficult to measure current intensities in difficult environments, for example in a damp atmosphere or other chemically aggressive media, because of the mandatory electrical contacting of the measuring resistor. Even the use of generic methods and systems in which magnetic field-sensitive sensor elements are used cannot eliminate these disadvantages. It is true that the use of such a magnetic field-sensitive sensor element does not require integration of the sensor element into the circuit of the electrical conductor. But such a magnetic field-sensitive sensor element must also be read out by galvanic contacting, which entails the same disadvantages that occur when using measuring resistors as sensor elements, and in addition, it must be ensured that the sensor element is arranged in a fixed position relative to the conductor when it is read out to measure the current intensity flowing in the conductor. In prior art, solutions to overcome the above-mentioned disadvantages are usually based on the fact that the sensor element is provided in the first component together with a radio transmission module, via which it is possible to read out the sensor element by means of a corresponding radio receiver integrated in a second component together with the evaluation device. Although this achieves scalability, i.e., use of the same second component for measuring electrical current intensities in different conductors, as well as galvanic isolation between the evaluation device and the electrical conductor, these approaches lead to considerable manufacturing costs both on the part of the first component with the electrical conductor and on the part of the second component. Another approach for measuring an electric and/or magnetic field generated by an electric conductor is described in WO 2019/122693 A1. According to this approach, the electric or magnetic field is measured by transmitting light with a defined polarization through a gas in which the Zeeman or Stark effect occurs, wherein the light, after it has passed through the gas, is divided into portions of different polarization, wherein by forming ratios of the light intensity with different polarization, the strength of the magnetic field or electric field to be measured is inferred by taking into account the dependency of the influence the gas has on the rotation of the polarization of the light passing through it as a function of the strength of the applied field.

The present invention is based on the problem of providing a system and a method for measuring a current intensity of a current flowing through an electrical conductor, with which at least some of the disadvantages of known systems and methods are at least partially eliminated.

As one solution to said problem underlying the invention, the invention proposes a system having the features according to claim 1. The system comprises a first component, which comprises the electrical conductor, and a second component, which is separate from the first component. The first and second components can thus be detached from each other and moved independently of each other. The second component comprises an evaluation device. The system further comprises a magnetic field-sensitive sensor element and a connection line. The magnetic field-sensitive sensor element is an element that has a measurable property that changes as a function of the magnetic field applied to the sensor element, so that a measurement of the current intensity can be made via a change in the property of the sensor element. For example, the sensor element can be designed as a Hall element that indicates an output voltage as its property that is dependent on the magnetic field. For example, the sensor element can be a solid-state element in which energy levels of the electrons have a dependence on the magnetic field, so that when the solid-state element is excited with a fixed, constant external energy, the solid-state element emits light as a function of the applied magnetic field, the wavelength-dependent intensity profile of which depends on the magnetic field strength of the applied magnetic field. Concerning the magnetic field, the focus is, of course, on the magnetic field or its magnetic field strength at the location of the sensor element. In an operating state of the system, in which the components of the system are disposed in a fixed arrangement relative to one another, the sensor element is fixed in position to the first component in a determined operating position, the operating position being determined relative to the electrical conductor. This ensures that a change in the magnetic field detected by the sensor element is caused by a change in the current intensity of the current flowing through the conductor and not, for example, by a change in the position of the sensor element relative to the electrical conductor.

In the operating state, the sensor element is further connected to the second component by the connection line in that the connection line is connected at a first end to the sensor element and at a second end to the second component. The connection line is thus designed to transmit, in the operating state, information relating to the property of the sensor element that is dependent on the applied magnetic field from the sensor element to the second component and thus to the evaluation device integrated in the second component. The second component preferably has an interface via which the evaluation device is connected to the second end of the connection line in the operating state. For example, the second end of the connection line can be non-releasably fixed to the interface of the second component, so that the connection line is integrated in the second component. Alternatively, the connection line can be formed at its second end to correspond to the interface of the second component, wherein, in the operating state, the connection line and the second component are releasably connected to one another with their mutually corresponding interfaces for ensuring transmission of the information relating to the magnetic field-dependent property of the sensor element from the sensor element to the evaluation device. Accordingly, in one embodiment, the sensor element comprises an interface which, in the operating state, is connected to the first end of the connection line for ensuring a readout of the magnetic field dependent information from the sensor element via the connection line. The connection line may, for example, be non-releasably connected to the interface of the sensor element, so that the sensor element and the connection line constitute a one-piece component, or the connection line may have an interface at its first end which corresponds to the interface of the sensor element in such a way that the sensor element and the first end of the connection line are releasably connected to one another in the operating state while ensuring a readout of the sensor element via the connection line, wherein, in one embodiment, the first component and the first end of the connection line have corresponding mechanical interfaces by which a relative position of the first end of the connection line relative to the first component is determined in the operating state and, in this case, the interfaces of the sensor element located in the operating position and the first end of the connection line are connected to one another. According to the invention, the connection line is formed as a light guide, for example comprising at least one optical fiber. In any case, the connection line is a spatially limited body in which light can be determinately guided. For example, the connection line can also be formed as a transparent plastic light guide. In one embodiment, the sensor element is non-releasably connected to the first end of the connection line. In one embodiment, the sensor element is non-releasably connected to the first component. In one embodiment, the sensor element is non-releasably connected to the first end of the connection line and to the first component. In one embodiment, the connection line is formed as a connection line that is uninterrupted from the first end to the second end. In one embodiment, the connection line has a first connection line section forming the first end and a second connection line section forming the second end, the two connection line sections being releasably connected to each other in the operating state.

In the operating state, the two components are electrically isolated from one another and are releasably connected to one another by means of the connection line with a light-guiding connection, the light-guiding connection ensuring a power supply to the magnetic field-sensitive sensor element by the second component and/or ensuring a transmission of sensor data from the magnetic field-sensitive sensor element to the evaluation device. In this case, the sensor data comprise information about the magnetic field-dependent property of the sensor element explained above. In an embodiment in which the light-guiding connection ensures a power supply of the magnetic field-sensitive sensor element by the second component, the sensor element, the second component, and the connection line are designed to correspond to each other in such a way that, in the operating state, a power supply is provided from the second component to the sensor element for operating the sensor element and thus for obtaining sensor data from the sensor element. For example, the energy supply can consist in light beams, in particular light pulses, being transmitted from the second component to the sensor element via the connection line, for example by the second component having a diode, in particular a laser diode, and by the connection line being connected to an interface of the sensor element that is designed as an optical connection of the sensor element. This can, for example, result in an excitation of the sensor element, which excites the sensor element to emit light with a wavelength-dependent intensity profile dependent on the applied magnetic field. In a generally preferred embodiment, the second component includes a supply port for connecting the second component to a power source, such as a battery or a supply line. In one embodiment, a transmission of sensor data from the magnetic field-sensitive sensor element to the evaluation device is ensured in the operating state via the light-guiding connection, for example by the second component, the connection line and the sensor element being designed to correspond to one another in such a way that the sensor element can emit light beams in which the sensor data are contained as information. Accordingly, the connection line can be connected to the interfaces of the sensor element and the second component, which are designed as optical connections. For example, the sensor element can comprise a diode, wherein it feeds the sensor data into the connection line by means of the diode, for example by the sensor data being modulated onto the light beam emitted by the diode through frequency modulation or by the sensor data being encoded as a light pulse length. For example, the sensor element can also be designed as a solid-state element which emits light when excited by external energy, in particular in response to an energy supply by the second component, in particular by electrons in the solid-state element dropping from an excited energy level to a stable energy level, the sensor element outputting as sensor data light with an intensity profile dependent on the applied magnetic field strength.

The invention has significant advantages over conventional systems. By fixing the sensor element in a fixed position relative to the electrical conductor in a determined operating position in the operating state, it is ensured that the sensor data read out by the sensor element have a definite dependence on the magnetic field generated by the electrical conductor when current flows through the electrical conductor. In one embodiment, the sensor element is integrated in the first component for this purpose, so that the sensor element permanently holds the determined operating position relative to the electrical conductor, in particular not releasably without destruction. In one embodiment, a mechanical interface is provided on the sensor element or a component of the system comprising the sensor element, which mechanical interface is designed to correspond to a mechanical interface provided on the first component, the two mutually corresponding mechanical interfaces of sensor element or component comprising the sensor element and the first component being brought into engagement with one another in order to establish the operating state, as a result of which the determined operating position of the sensor element is necessarily fixed in the operating state. Furthermore, by designing the connection line as a light guide, galvanic decoupling between the sensor element and the evaluation device, in particular between the first and the second component, is possible during the performance of a measurement, i.e., while the system is in its operating state and sensor data can be read out from the sensor element by the evaluation device. Furthermore, unlike electrical conductors, the design of a light guide is possible without problems in a chemically inert manner. Therefore, the system according to the invention is particularly suitable for use in chemically demanding environments. Furthermore, the system according to the invention can be scaled to large scales at low cost. For example, first components can be provided which each have a mechanical interface, in particular each have an identical mechanical interface which is designed to correspond to a mechanical interface formed on the sensor element or a system component having the sensor element or, when the sensor element is integrated in the first components, is designed to correspond to a mechanical interface provided on the connection line or on the second component. In this way, a readout of sensor data and/or an energy supply of the sensor element by the second component can be ensured in a very simple manner by means of always the same measuring principle via the connecting line, wherein in particular for the realization of the operating state exclusively a mechanical coupling of the first and second component, which are designed as separate components, is required, wherein this mechanical coupling ensures an optical coupling between the sensor element and the evaluation device, especially an exclusively optical coupling.

In one embodiment, either the connection line is non-releasably connected to a connecting device of the second component and thus integrated in the second component, or the connection line is releasably connected to the connecting device of the second component in the operating state by means of cooperating mechanical interfaces provided at its second end and on the second component. Preferably, the corresponding mechanical interfaces of the second component and the second end of the connection line uniquely define the relative position of the second end of the connection line to the second component. Due to the non-detachable integration of the connection line in the second component or the provision of corresponding mechanical interfaces, a low-fault sensor data transmission and/or a low-fault power supply of the sensor element by the second component is particularly reliably ensured in the operating state. In one embodiment, the sensor element is integrated in the first component in a positionally fixed manner relative to the electrical conductor or is releasably fixed in the determined operating position on the first component by interaction of the mechanical interfaces of the sensor element and the first component in the operating state. The positionally fixed integration of the sensor element in the first component or the provision of corresponding mechanical interfaces ensures particularly reliably that the sensor data have a clearly defined dependence on the current flowing through the conductor. In one embodiment, the connection line is connected to the sensor element in a determined connection position in the operating state, wherein the connection line is releasably or non-releasably connected to the first component in the operating state. The determined connection position ensures a particularly error-reduced transmission of sensor data from the sensor element through the connection line or a power supply to the sensor element via the connection line. In one embodiment, the sensor element is non-releasably connected to the connection line, so that the sensor element and connection line form one component of the system. In this case, the connection line is permanently connected to the sensor element in the determined connection position. In one embodiment, the sensor element is integrated in a separate system component or in the first component. The separate system component may form a connection line section that is releasably connected to a second connection line section of the connection line via corresponding mechanical interfaces, or is non-releasably connected forming the connection line in the operating state. In one embodiment, the sensor element is integrated in the first component. In the case of a detachable connection of the connection line and the sensor element in the operating state, it is always provided that the sensor element or the component of the system comprising the sensor element, in particular the first component comprising the sensor element, have mutually corresponding mechanical interfaces via which the determined connection position is defined in the operating state.

In one embodiment, the two components, i.e., the first and the second component, are connected to each other in the operating state exclusively via the sensor element and the connection line, with sensor data being transmitted exclusively optically via the connection line. By the first and second component being connected exclusively via the connection line in the operating state, on the one hand the operating state can be established in a particularly simple manner and, moreover, the coupling between the first and the second component required for establishing the operating state can be as small as possible, which can be advantageous in particular for avoiding errors during the measurement and for avoiding damage or an interference with the first component. Particularly preferably, the connection line is designed as a light guide.

In one embodiment, the second component is designed to output light with a first wavelength-dependent intensity profile to the sensor element for power supply via the connection line and to receive light with a second wavelength-dependent intensity profile as sensor data from the sensor element and to process it for outputting a value for the current intensity. Here, the first wavelength-dependent intensity profile differs from the second wavelength-dependent intensity profile. The wavelength-dependent intensity profile of light indicates the intensity of light with its wavelength dependence. The integral of the wavelength-dependent intensity profile over the wavelength thus gives the total intensity of the light. The first and second wavelength-dependent intensity profiles may differ, for example, in that the integral over the first wavelength-dependent intensity profile and thus the intensity of the light with the first wavelength-dependent intensity profile is greater than the integral of the second wavelength-dependent intensity profile over the wavelength, which indicates the intensity of the light with the second wavelength-dependent intensity profile. Further, in particular additionally, the first and second wavelength-dependent intensity profiles may differ in their wavelength dependence, such that the first wavelength-dependent intensity profile has a different wavelength dependence and thus a different profile contour than the second wavelength-dependent intensity profile. Particularly preferably, the first wavelength-dependent intensity profile has a different mean wavelength than the second wavelength-dependent intensity profile, the mean wavelength being determined by averaging over all wavelengths of the intensity profile at which the intensity assigned to the respective wavelength is at least 5% of the maximum of the intensity profile, the wavelengths being weighted with their respective assigned intensity of the intensity profile during averaging. The weighting can be carried out in such a way, for example, that when calculating the average wavelength, all the wavelengths which are included in the averaging are multiplied by the intensity of the wavelength-dependent intensity profile assigned to them in each case, while generating a respective product, these generated products being added to form a sum, this sum being divided by the sum of the intensities assigned to the said wavelengths in each case. Particularly preferably, the average wavelength of the first wavelength-dependent intensity profile is smaller than the average wavelength of the second wavelength-dependent intensity profile. In a particularly preferred embodiment, both an energy supply and thus excitation of the sensor element can take place through the second component in the operating state and a readout of the sensor element or of the sensor data from the sensor element can take place. Preferably, the second wavelength-dependent intensity profile is dependent on the magnetic field applied to the sensor element. This can be implemented in particular when the sensor element is designed as a solid-state element in which different energy levels are set for the electrons as a function of the applied magnetic field, so that when the sensor element is excited with an always unchanged first wavelength-dependent intensity profile, the sensor element emits light with a second wavelength-dependent intensity profile dependent on the magnetic field during a recombination as a function of the respective energy level set by the magnetic field applied in each case. In one embodiment, the sensor element comprises a material which has different energy levels for its electrons, at least one of the energy levels being variable in the presence of a magnetic field, it being understood that this focuses on the presence of an external magnetic field in which the sensor element and thus the material comprising the sensor element is arranged, for example, the magnetic field generated by the current flowing through the conductor being such an external magnetic field in which the sensor element is arranged in the operating state of the system.

According to the invention, the second component comprises a light source and a light sensor. The light source can, for example, be an LED or a laser diode. The light sensor can, for example, comprise a photodiode, can in particular only be a photodiode or a photodiode array, or can be designed as a CCD chip. The first component, the second component, the sensor element, and the connection line are preferably designed to correspond to one another in such a way that, in the operating state, the sensor element can be excited to emit fluorescent radiation with a second wavelength-dependent intensity profile by means of a light beam, especially a light pulse, which is generated by and starting from the light source of the second component and is transmitted to the sensor element via the connection line and which has a first wavelength-dependent intensity profile, the fluorescent radiation, in the operating state, being transmittable to the second component via the connection line and whose wavelength-dependent intensity profile can be resolved by the light sensor, the second wavelength-dependent intensity profile being dependent on the magnetic field while the first wavelength-dependent intensity profile remains constant. The second component is thus designed to emit light with a first wavelength-dependent intensity profile via its light source in the operating state, in particular in the form of a light pulse, and to feed this light into the connection line, via which it is transmitted to the sensor element, the second component being further designed to receive light with the wavelength-dependent intensity profile from the sensor element, likewise via the connection line, after the light has been emitted and to resolve the second wavelength-dependent intensity profile via its light sensor. The resolution of the second wavelength-dependent intensity profile can be, for example, a resolution of the total intensity in a fixed wavelength range, i.e., the distinction of different total intensities in this wavelength range, and/or a resolution of the wavelength dependence of the intensity profile, i.e., outputting in each case one intensity for in each case one discrete wavelength or one discrete wavelength range, and this for a plurality of different discrete wavelengths or wavelength ranges. Particularly preferably, the light sensor is designed in such a way that it enables a resolution of the second wavelength-dependent intensity profile so high that different electric currents can be resolved with the system in the operating state, with a resolution of at least 50 mA, in particular at least 10 mA, in particular at least 5 mA, in particular at least 1 mA. For this purpose, the light sensor of the second component, the light source of the second component, the connection line, and the sensor element are designed to correspond accordingly to one another. In general, it has proven to be particularly advantageous to design the light sensor in such a way that the total intensity of the light impinging on the light sensor is determined by the light sensor in a specific wavelength range or in each case the total intensity in a plurality of specific wavelength ranges, the plurality of specific wavelength ranges being spaced from one another with respect to wavelength. For example, such a light sensor may comprise a filter allowing only light in the particular wavelength range to pass through, wherein when a plurality of particular wavelength ranges are provided, for example, the filter is changeable to filter the light in the various particular wavelength ranges, wherein the total intensity is then determined sequentially for each particular wavelength range, or, for example, the light sensor may comprise a plurality of filters, each associated with a particular wavelength range, wherein a separate total intensity measurement is made downstream of each filter. In one embodiment, the light sensor comprises a photodiode. Particularly preferably, the photodiode limits the particular wavelength range by its inherent sensitivity to an intensity limited to a particular wavelength range, wherein a measured value from the photodiode, in particular a measured value characterizing the current generated by the light in the photodiode, is output for the total intensity measurement. Particularly preferably, the determined wavelength range is determined exclusively by the photodiode and thus without the provision of a filter. It has been found to be particularly advantageous to provide a paramagnetic material as the material of the sensor element. In general, the material is preferably designed in such a way that a splitting of the energy levels according to the Zeeman effect occurs in the presence of a magnetic field. According to the invention, a diamond crystal with a plurality of nitrogen-vacancy centers is used as a material of the sensor element.

Particularly preferably, the evaluation device is designed to output a value for the current flowing through the conductor with a resolution of at least 50 mA, in particular 10 mA, in particular at least 5 mA, when the current is conducted through the conductor in an ampere range between 100 mA and 500 mA, in particular between 100 mA and 1 kA, in particular between 50 mA and 1.5 kA. For this purpose, the sensor element is suitably fixed in position on the electrical conductor in its operating position and the second component and the connection line are designed accordingly, so that a change in the current intensity and thus in the magnetic field applied to the sensor element can be resolved with sufficient resolution by the evaluation circuit via the sensor data read out from the sensor element via the connection line.

In general, the connection line is preferably non-releasably connected to the first component or to the second component. In one embodiment, the connection line comprises two connection line sections, wherein the first connection line section is non-releasably connected to the first component and the sensor element is non-releasably connected to the first component, and wherein the second connection line section is non-releasably connected to the second component. Corresponding mechanical interfaces can be formed between connection line sections, which ensure the most error-free optical transmission possible between the connection line sections in the operating state. In general, the first component and the second component preferably have mutually corresponding mechanical connection devices via which the two components can be releasably connected to one another in order to establish the operating state and which unambiguously define a relative position of a section of the first component with respect to a section of the second component with respect to one another in the operating state, preferably at least one of the components comprising at least one section of the connection line and the components being connected to one another via the connection line. Particularly preferably, in the operating state, the first end of the connection line is directly in contact with an optical connection of the sensor element and the second end of the connection line is directly in contact with an optical connection of the second component.

The invention further relates to a method for measuring a current intensity of a current flowing through an electrical conductor. The electrical conductor is integrated in a first component. In the method according to the invention, a magnetic field-sensitive sensor element fixed in a positionally fixed manner with respect to the electrical conductor is connected via a connection line to a second component in which an evaluation device is integrated, the sensor element being read out by the evaluation device via the connection line. A light guide is used as the connection line. The two components are releasably connected to one another via the connection line, while a galvanic isolation existing between the two components is maintained, with an optical connection, in particular exclusively an optical connection in addition to the mechanical connection existing per se, being simultaneously provided between the sensor element and the second component via the connection line. It should be taken into account that the two components are two separate components which are galvanically isolated from each other per se, wherein during the implementation of the method according to the invention, during which the two components are releasably connected to each other via the connection line, the existing galvanic isolation is maintained. After the two components have been connected to one another via the connection line, the magnetic field-sensitive sensor element is supplied with energy from the second component and/or sensor data are transmitted from the magnetic field-sensitive sensor element to the evaluation device by means of the light-guiding connection. The sensor element comprises a material which has different energy levels for its electrons, at least one of the energy levels being variable in the presence of a magnetic field. A light beam which has a first wavelength-dependent intensity profile is generated by a light source of the second component and is transmitted to the sensor element via the connection line, and the material of the sensor element is excited by the light beam to emit fluorescence radiation having a second wavelength-dependent intensity profile. The fluorescence radiation with the second wavelength-dependent intensity profile is transmitted to the second component via the connection line, and the second wavelength-dependent intensity profile depends on the magnetic field while the first wavelength-dependent intensity profile remains constant. The second wavelength-dependent intensity profile of the fluorescence radiation is resolved by a light sensor of the second component. A crystal having a plurality of nitrogen-vacancy centers is used as material of the sensor element. The method according to the invention may have further features which are explained in connection with the system according to the invention. The system according to the invention and the method according to the invention may further each have features which are explained above in connection with methods or systems known in the prior art.

One embodiment of the invention will now be described in more detail with reference to two drawing figures.

FIG. 1: is a schematic diagram showing one embodiment of a system according to the invention in its operating state;

FIG. 2: is a schematic diagram showing an enlarged view of components of the system according to the invention as shown in FIG. 1 in the operating state.

The embodiment of a system according to the invention shown in FIGS. 1 and 2 has a first component 1 in which an electrical conductor 10 is integrated. The system further comprises a second component 2 in which an evaluation device 23 as well as a light source 21 and a light sensor 22 are integrated. The system further comprises a magnetic field-sensitive sensor element 3 as well as a connection line 4. In the embodiment described, the first component 1, the second component 2, the connection line 4, and the sensor element 3 are components of the system which are separate from one another, but in the operating state assume a determined arrangement and thus in each case fixed positions relative to one another. The connection line 4 is designed as a continuous light guide, which is generally advantageous according to the invention. The connection line 4 extends from its first end to its second end and is uninterrupted both between its ends and in its cross-section that extends perpendicularly to its progression between its ends, which is also generally advantageous according to the invention. Due to the uninterrupted design of the connection line 4, the construction of the system according to the invention is particularly simplified and faults can be particularly advantageously avoided.

In the embodiment described, the electrical conductor 10 is fixed in position in the first component 1, and the first component 1 has, as a mechanical interface, a receptacle into which one side of the sensor element 3 designed as a mechanical interface of the sensor element 2 can be inserted in a fit for achieving the operating state in which the corresponding mechanical interfaces ensure latching of the elements connected to one another by said mechanical interfaces, which is generally advantageous according to the invention. In the operating state, the sensor element 3 is fixed in position in the receptacle of the first component 1. The sensor element 3 has a further mechanical interface 34 which is designed to correspond to a mechanical interface 41 formed at the first end of the connection line 4, the mechanical interfaces 34, 41 of sensor element 3 and connection line 4 being designed to correspond to one another in such a way that in the operating state, the sensor element 3 is fixed with its optical connection in a positionally fixed manner relative to the first end of the connection line 4 and is arranged and held in a position relative to the first end of the connection line 4 which is fixed by the mechanical interfaces 34, 41. At its second end, the connection line 4 has a second mechanical interface 42, via which it is positionally fixed in the operating state to a corresponding mechanical interface 24, which at the same time forms an optical connection of the second component 2, whereby the operating state is established in which the second end of the connection line 4 is arranged in a fixed position at the optical connection of the second component 2. Thus, in the operating state, the sensor element 3 and the second component 2 are connected to each other exclusively through the connection line 4. Accordingly, in the operating state, the first component 1, on which the sensor element 3 is held positionally fixed in the operating state, is connected to the second component 2 exclusively via the connection line 4.

The second component 2 has a light source 21 designed as a laser diode and a light sensor 22 designed as a photodiode. The light source 21 and the light sensor 22 are connected to an evaluation device 23 that is comprised by the second component 2 and includes a microprocessor and a memory, which is generally advantageous according to the invention. On the one hand, the light source 21 and the light sensor 22 can be controlled via the evaluation device 23 and, on the other hand, the light sensor 22 can be read out, which is generally advantageous according to the invention. The second component 2 is designed to output a light pulse with a first wavelength-dependent intensity profile to the sensor element 3 via its light source 21 in the operating state and to resolve the second wavelength-dependent intensity profile with its light sensor 22, this second wavelength-dependent intensity profile characterizing the light which the sensor element 3 emits in response to having been excited by light from the light source 21. In the present case, the sensor element 3 is designed as an NV diamond crystal in which, in accordance with the Zeeman effect, a splitting of energy levels occurs when a magnetic field is applied. Due to the spatially close arrangement of the sensor element 3 on the electrical conductor 10 of the first component 1 in the operating state, when an electric current flows through the electrical conductor 10, the sensor element 3 is arranged in the magnetic field forcibly generated by the electric current. Due to the magnetic field strength dependence of energy levels of the sensor element 3, the second wavelength-dependent intensity profile changes depending on the magnetic field strength generated at the sensor element by the current flowing through the electrical conductor 10 when the sensor element 3 is excited by the light source 21 with always the same first wavelength-dependent intensity profile. The evaluation device 23 is arranged to read out the light sensor 22 in order to determine the total intensity of the second wavelength-dependent intensity profile in a wavelength range determined by the photodiode. The evaluation device 23 is arranged to convert the determined total intensity into information relating to the current intensity flowing through the electrical conductor 10. In a further embodiment, the light sensor 22 is designed as a CCD chip or other device by means of which a respective assigned intensity can be determined for different discrete wavelength ranges. Particularly preferably, a mean wavelength, averaged over the intensity, of the second wavelength-dependent intensity profile is determined, i.e., an average value of the wavelength of the second wavelength-dependent intensity profile is determined, the respective wavelength being weighted with the respective intensity value to the respective wavelength of the wavelength-dependent intensity profile in averaging. The evaluation device 23 is designed to process the wavelength information relating to the wavelength of the second wavelength spectrum and to convert it into information relating to the current intensity flowing through the electrical conductor 10. This respective information regarding the current intensity is output by the second component 2 at its output 25 in the operating state.

In other embodiments, the evaluation device 23 is only designed to determine at least one wavelength of the second wavelength-dependent intensity profile and to output this at the output 25 of the second component, with a further device being connected at the output 25 which assigns the at least one wavelength determined in each case to a specific current value.

LIST OF REFERENCE SIGNS

1 first component
2 second component
3 magnetic field-sensitive element
4 connection line
10 electrical conductor
21 light source
22 light sensor
23 evaluation device
24 mechanical interface
25 output
34 mechanical interface
41 first mechanical interface
42 second mechanical interface

The invention claimed is:

1. A system for measuring a current intensity of a current flowing through an electrical conductor (10), the system comprising:

a first component (1), which has the electrical conductor (10);

a second component (2), which is separate from the first component and comprises an evaluation device (23);

a magnetic field-sensitive sensor element (3); and a connection line (4), and wherein, in an operating state, the sensor element (3) is fixed in a positionally fixed manner to the first component (1) in a determined operating position, the operating position being determined relative to the electrical conductor (10), and is connected to the second component (2) by the connection line (4) in that the connection line (4) is connected with a first end to the sensor element (3) and with a second end to the second component (2), wherein the connection line (4) is a light guide wherein in the operating state, the first and second components (1, 2) are galvanically isolated from one another and are releasably connected to one another by the connection line (4) by way of a light-guiding connection, wherein a power supply to the magnetic field-sensitive sensor element (3) by the second component (2) and/or a transmission of sensor data from the magnetic field-sensitive sensor element (3) to the evaluation device (23) is ensured by the light-guiding connection, wherein the sensor element (3) comprises a material which has different energy levels for its electrons, at least one of the energy levels being variable in a presence of a magnetic field, the second component (2) comprising a light source (21) and a light sensor (22), wherein the material is configured to be excited, in the operating state, to emit fluorescent radiation with a second wavelength-dependent intensity profile excited solely by a light beam which is generated starting from the light source (21) of the second component (2) and is transmitted to the sensor element (3) via the connection line (4) and which has a first wavelength-dependent intensity profile, the fluorescent radiation with the second wavelength-dependent intensity profile in the operating state being transmittable to the second component (2) via the connection line (4), the second wavelength-dependent intensity profile being dependent on the magnetic field while the first wavelength-dependent intensity profile remains constant, wherein the second wavelength-dependent intensity profile of the fluorescent radiation being resolved by the light sensor (22), wherein a-diamond crystal having a plurality of nitrogen-vacancy centers is used as the material of the sensor element.

2. The system according to claim 1, wherein either the connection line (4) is non-releasably connected to a connecting device of the second component (2) or the connection line (4) is releasably connected to the connecting device of the second component (2) in the operating state by means of interacting mechanical interfaces (24, 25, 41, 42) provided at its second end and on the second component (2).

3. The system according to claim 1, where the sensor element (3) is integrated in the first component (1) in a positionally fixed manner relative to the conductor (10).

4. The system according to claim 1, wherein the sensor element (3) is releasably fixed in the determined operating position on the first component (1) by interacting mechanical interfaces (24, 25, 41, 42) of the sensor element (3) and the first component (1) in the operating state.

5. The system according to claim 1, wherein the connection line (4) is connected to the sensor element (3) in a determined connecting position in the operating state, the connection line (4) is releasably connected to the first component (1) in the operating state.

6. The system according to claim 1, wherein the connection line (4) is connected to the sensor element (3) in a determined connecting position in the operating state, the connection line (4) being non-releasably connected to the first component (1) in the operating state.

7. The system according to claim 1, wherein the connection line (4) is non-releasably connected to the first component (1) or to the second component (2).

8. The system according to claim 1, wherein, in the operating state, the first and second components (1, 2) are connected to one another exclusively via the sensor element (3) and the connection line (4) and the transmission of sensor data takes place exclusively optically via the connection line (4).

9. The system according to claim 1, wherein the first component (1) and the second component (2) have mechanical connecting devices corresponding to one another, via which the first and second components (1, 2) can be connected to one another in order to establish the operating state and which unambiguously define a relative position of a section of the first component (1) with respect to a section of the second component (2) with respect to one another in the operating state.

10. The system according to claim 1, wherein the evaluation device is designed to output a value for the current flowing through the conductor (10) with a resolution of at least 50 mA when the current is conducted through the conductor (10) in an ampere range between 50 mA and 1.5 kA.

11. The system according to claim 1, wherein the first component (1) and the second component (2) have mechanical connecting devices corresponding to one another, via which the first and second components (1, 2) can be connected to one another in order to establish the operating state and which unambiguously define a relative position of a section of the first component (1) with respect to a section of the second component (2) with respect to one another in the operating state, wherein in the operating state, the first end of the connection line (4) is directly in contact with an optical connection of the sensor element (3) and the second end of the connection line (4) is directly in contact with an optical connection of the second component (2).

12. The system according to claim 1, wherein the evaluation device is designed to output a value for the current flowing through the conductor (10) with a resolution of at least 50 mA when the current is conducted through the conductor (10) in an ampere range between 100 mA and 1 kA.

13. The system according to claim 1, wherein the evaluation device is designed to output a value for the current flowing through the conductor (10) with a resolution of at least 10 mA when the current is conducted through the conductor (10) in an ampere range between 100 mA and 1 kA.

14. The system according to claim 1, wherein the evaluation device is designed to output a value for the current flowing through the conductor (10) with a resolution of at least 5 mA when the current is conducted through the conductor (10) in an ampere range between 100 mA and 1 kA.

15. The system according to claim 1, wherein the evaluation device is designed to output a value for the current flowing through the conductor (10) with a resolution of at least 10 mA when the current is conducted through the conductor (10) in an ampere range between 50 mA and 1.5 kA.

16. The system according to claim 1, wherein the evaluation device is designed to output a value for the current flowing through the conductor (10) with a resolution of at least 5 mA when the current is conducted through the conductor (10) in an ampere range between 50 mA and 1.5 kA.

17. The system according to claim 1, wherein the second component (2) receives the light with the second wavelength-dependent intensity profile as sensor data from the sensor element (3) and processes it for outputting a value for the current intensity flow through the electrical conductor.

18. The system according to claim 1, wherein the light beam is a light pulse.

19. A method for measuring a current intensity of a current flowing through an electrical conductor (10), the electrical conductor (10) being integrated in a first component (1), wherein a magnetic field-sensitive sensor element (3) is fixed in position relative to the electrical conductor (10) and is connected via a connection line (4) to a second component (2) in which an evaluation device (23) is integrated, and is read out by the evaluation device (23), wherein a light guide is used as the connection line (4), the first and second components (1, 2) are releasably connected to one another via the connection line (4) and a galvanic isolation existing between the first and second components (1, 2) is maintained and a light-guiding connection being provided between the second component (2) and the sensor element, the light-guiding connection supplying the magnetic field-sensitive sensor element (3) with energy from the second component (2) and/or transmitting sensor data from the magnetic field-sensitive sensor element (3) to the evaluation device (23), wherein the sensor element (3) comprises a material which has different energy levels for its electrons, at least one of the energy levels being variable in a presence of a magnetic field, wherein a light beam which has a first wavelength-dependent intensity profile is generated with a light source (21) of the second component and the light beam is transmitted via the connection line (4) to the sensor element (3) and the material of the sensor element (3) is excited only by the light beam to emit fluorescent radiation with a second wavelength-dependent intensity profile, the fluorescent radiation with the second wavelength-dependent intensity profile being transmitted via the connection line (4) to the second component (2), the second wavelength-dependent intensity profile being dependent on the magnetic field while the first wavelength-dependent intensity profile remains constant, wherein the second wavelength-dependent intensity profile of the fluorescent radiation is resolved by a light sensor (22) and a diamond crystal having a plurality of nitrogen-vacancy centers is used as a material of the sensor element.

20. The method according to claim 19, wherein the second component (2) receives the light with the second wavelength-dependent intensity profile as sensor data from the sensor element (3) and processes it for outputting a value for the current intensity flow through the electrical conductor.

21. A system for measuring a current intensity of a current flowing through an electrical conductor (10), the system consisting of:

a first component (1), which has the electrical conductor (10);

a second component (2), which is separate from the first component and includes an evaluation device (23), the second component (2) comprising a light source (21) and a light sensor (22);

a magnetic field-sensitive sensor element (3), the sensor element (3) includes a material which has different energy levels for its electrons, at least one of the energy levels being variable in a presence of a magnetic field, the material includes a diamond crystal having a plurality of nitrogen-vacancy centers; and a connection line (4), the connection line (4) is a light guide, and wherein, in an operating state, the sensor element (3) is fixed in a positionally fixed manner to the first component (1) in a determined operating position, the operating position being determined relative to the electrical conductor (10), and the sensor element (3) is connected to the second component (2) by the connection line (4), wherein, in the operating state, the first and second components (1, 2) are galvanically isolated from one another and are releasably connected to one another by the connection line (4) by way of a light-guiding connection, wherein a power supply to the magnetic field-sensitive sensor element (3) by the second component (2) and/or a transmission of sensor data from the magnetic field-sensitive sensor element (3) to the evaluation device (23) is ensured by the light-guiding connection, wherein the material is configured to be excited, in the operating state, to emit fluorescent radiation with a second wavelength-dependent intensity profile based solely on a light beam which is generated starting from the light source (21) of the second component (2) and is transmitted to the sensor element (3) via the connection line (4) and which has a first wavelength-dependent intensity profile, the fluorescent radiation with the second wavelength-dependent intensity profile in the operating state being transmittable to the second component (2) via the connection line (4), the second wavelength-dependent intensity profile being dependent on the magnetic field while the first wavelength-dependent intensity profile remains constant, wherein the second wavelength-dependent intensity profile of the fluorescent radiation being resolved by the light sensor (22), and whereby the second component (2) is designed to receive the light with the second wavelength-dependent intensity profile as sensor data from the sensor element (3) and is designed to process it for outputting a value for the current intensity flow through the electrical conductor (10).

* * * * *